United States Patent [19]

Kubo et al.

[11] Patent Number: 4,916,449
[45] Date of Patent: Apr. 10, 1990

[54] WIDE DYNAMIC RANGE DIGITAL TO ANALOG CONVERSION METHOD AND SYSTEM

[75] Inventors: Mitsumasa Kubo, Iruma; Tetsuro Araki, Hachioji, both of Japan

[73] Assignee: Teac Corporation, Tokyo, Japan

[21] Appl. No.: 118,261

[22] Filed: Nov. 9, 1987

Related U.S. Application Data

[62] Division of Ser. No. 881,396, Jul. 2, 1986, abandoned.

[30] Foreign Application Priority Data

Jul. 9, 1985 [JP] Japan ................................ 60-150566
Feb. 28, 1986 [JP] Japan .................................. 61-43555

[51] Int. Cl.$^4$ ............................................. H03M 1/20
[52] U.S. Cl. .................................... 341/131; 341/141; 341/144
[58] Field of Search ................. 341/131, 139, 141, 144

[56] References Cited

U.S. PATENT DOCUMENTS

| | | | |
|---|---|---|---|
| 4,550,309 | 10/1985 | Hiller et al. ......................... | 341/131 |
| 4,686,509 | 8/1987 | Araki et al. ......................... | 341/141 |
| 4,700,173 | 10/1987 | Araki et al. ......................... | 341/141 |
| 4,751,496 | 6/1988 | Araki et al. ......................... | 341/131 |
| 4,845,498 | 7/1989 | Kubo et al. ......................... | 341/131 |

Primary Examiner—William M. Shoop, Jr.
Assistant Examiner—Marc S. Hoff
Attorney, Agent, or Firm—Woodcock Washburn Kurtz Mackiewicz & Norris

[57] ABSTRACT

A method and apparatus well suited for the conversion of a digitized audio signal into analog form with as wide a dynamic range as possible. A digital dither signal is added to a digital audio or like data signal to provide a digital data/dither signal. This digital data/dither signal and the digital dither signal are both converted into an analog data/dither signal and an analog dither signal respectively, and the analog dither signal is subtracted from the analog data/dither signal to obtain an analog data signal equivalent to the digital data signal. The level of the incoming digital data signal may be so high that when the digital dither signal is added thereto, the total level of the data/dither signal may exceed the capacity of the digital to analog converter in use. In that case the digital dither signal is either gated off or reduced in level, with the result that the digital to analog converter inputs either the data signal only or the data/dither signal having a total level not exceeding its capacity.

7 Claims, 8 Drawing Sheets

WIDE DYNAMIC RANGE DIGITAL TO ANALOG CONVERSION METHOD AND SYSTEM

This is a division of application Ser. No. 881,396, filed Jul. 2, 1986, now abandoned.

BACKGROUND OF THE INVENTION

Our invention relates to the conversion of electric signals from digital to analog form. More specifically, our invention pertains to a method of, and a system for, translating a digital data signal such as a digitized audio or video signal into an equivalent analog signal, with the addition of digital dither (an artificially created white noise signal) to the digital data signal and the subsequent removal of the dither from the analog data signal, with a view to the reduction of noise and distortion. Still more specifically, our invention concerns improvements in such a method and system whereby the digital dither to be added to the data signal is suppressed or reduced in level, as required, for the digital to analog coversion of the data signal with a greater dynamic range than heretofore under the same limitations of the hardware in use.

The pulse code modulation (PCM) or digital processing of audio signals has become, or is becoming, the mainstream of high fidelity sound recording and reproduction with the advent and ever increasing commercial acceptance of compact discs (CDs). However, some problems remain unsolved, or not perfectly solved, in the art of digital sound processing. One of these is the "quantization noise", that is, the differences between the samples of the music wave and the quantized values of the samples. The quantization noise becomes particularly pronounced, distorting the reproduced sound as higher harmonics, when the input signal level is low and there are a relatively small number of quantization steps. Even when the input signal level is high, the quantization noise will distort the signal if it changes slowly.

We are aware of a conventional solution to this quantization noise problem. The solution involves the use of dither for turning the quantization noise into white noise which hardly affects the appreciation of the reproduced sound. A digital dither signal is superposed on the audio signal prior to its digital to analog conversion and, following the conversion, is removed from the analog audio signal. This technique is discussed extensively in the article entitled "The Application of Large Amplitude Dither to the Quantization of Wide Range Audio Signals" by Yoshio Yamasaki in *The Journal of the Acoustical Society of Japan*, Vol. 39, No. 7, published 1983.

We have found that this known solution has a weakness. As digital dither is added to the digital audio or other data signal, the total level of the resulting data and dither signal may exceed the capacity (maximum allowable input level) of the digital to analog (D/A) converter used for the conversion of the data and dither signal, particularly when the data signal level is high. There might be contemplated the use of a D/A converter, as well as an adder for the addition of data and dither, of sufficiently large capacity to accept the expected maximum level (number of bits) of the combined data and dither signal. Such hardware is very expensive and so impractical.

It is more practical to employ a D/A converter and adder of minimal capacities required; for example, the converter and adder may be each constructed to accept only the number of bits (e.g. sixteen) of which the digital data signal is composed. The use of such limited capacity converter and adder has conventionally necessitated the reduction, as required, of the level of the data signal when it is combined with the digital dither by the adder, to such an extent that the combined data and dither signal may not overflow the adder. This of course incurs the sacrifice of the dynamic range to the detriment of the high fidelity reproduction of music.

SUMMARY OF THE INVENTION

We have hereby discovered how to assure an optimum dynamic range in the digital to analog conversion of audio or other data signals with the introduction and later removal of dither to and from such signals, with the use of a D/A converter and associated means of minimal capacities.

According to our invention, stated in brief, the level of a digital dither signal to be added to a digital data signal is limited, as required, in order that the total level of the resulting digital data and dither signal may fall within the capacity of a D/A converter used for the conversion of at least the data and dither signal from digital to analog form.

In the practice of our invention, the varying level of the digital data signal is discriminated from the digital data signal itself or from its combination with the digital data signal. Whenever the digital data signal level is found to exceed a prescribed limit, the digital dither signal is gated off or, alternatively, reduced in level to such a degree that the total level of the resulting combination of data and dither does not exceed the capacity of the D/A converter. It is therefore possible to employ a smaller capacity D/A converter than heretofore for the conversion of the full amplitude of the data signal.

The above and other features and advantages of our invention and the manner of realizing them will become more apparent, and the invention itself will best be understood, from a study of the following description and appended claims, with reference had to the attached drawings showing some preferable embodiments of our invention.

DETAILED DESCRIPTION OF THE INVENTION

Figure 1:
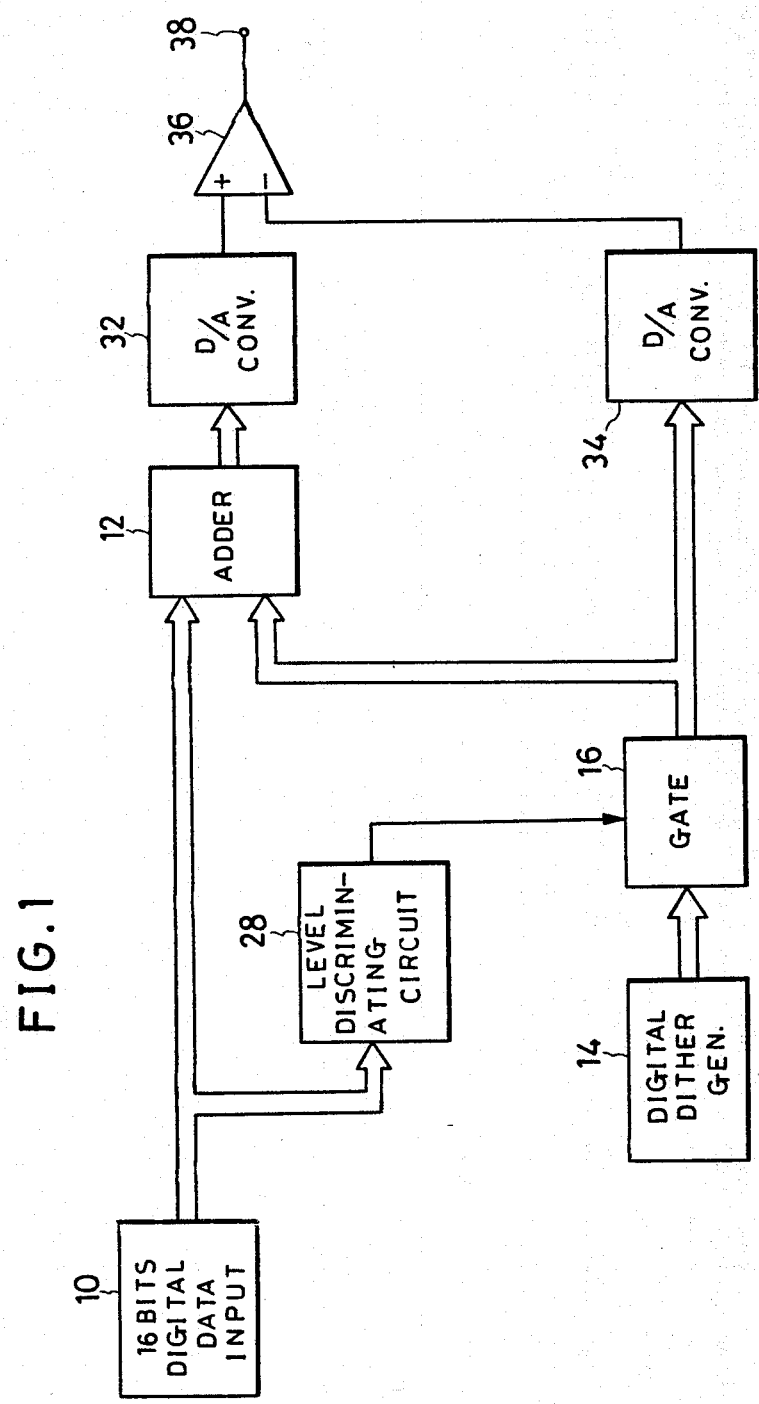
FIG. 1 is a block diagram of the digital to analog conversion system embodying the principles of our invention.

We will now describe our invention in terms of a first preferable embodiment thereof illustrated in FIG. 1. We have shown in this figure the digital to analog conversion system of our invention as adapted for use in a CD player. The representative system has an input circuit 10 for receiving the digital data signal to be transformed into an equivalent analog signal. We are using the term "data signal" to mean any such signal that can be processed in accordance with our invention. The particular data signal to be processed by the FIG. 1 system is an audio signal that has been digitized, for example, by the offset binary code, with each word consisting of 16 bits. The sampling rate may be 88.2 kilohertz. The input circuit 10 inputs the 16 bits of the digitized audio signal in parallel.

The input circuit 10 is connected to one of the two inputs of a digital adder 12 of the full adder configuration. To the other input of the adder 12 is connected a digital dither generator 14 via a gate circuit 16. We understand that in this particular embodiment, the adder 12 can handle only 16 bits by reason of economy. The dither generator 14 generates a 12 bits digital dither signal in a pseudorandom fashion.

Figure 2:
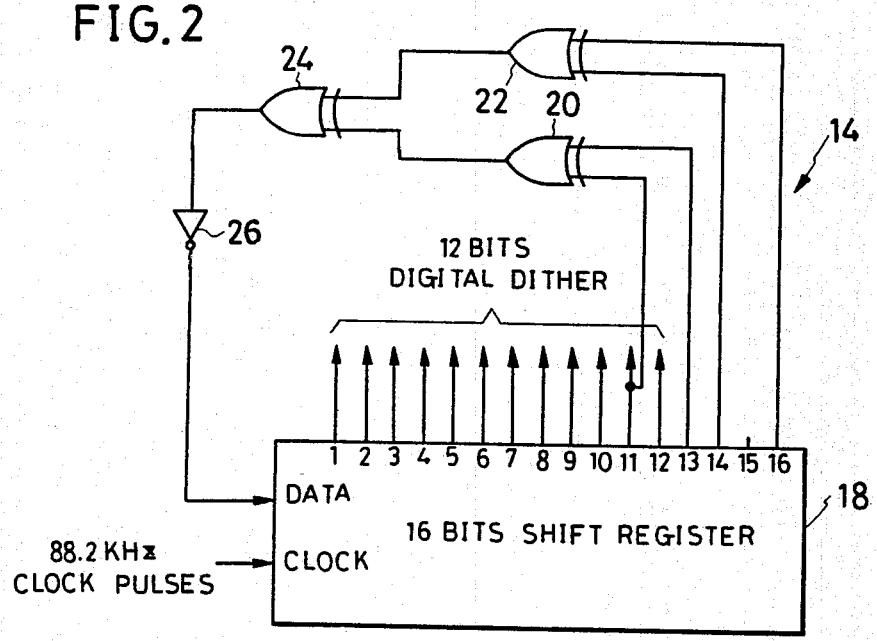
FIG. 2 is a block diagram of a digital dither generator used in the system of FIG. 1.

As illustrated in detail in FIG. 2, the digital dither generator 14 can be of conventional circuit design known as the maximum length pseudorandom pulse generator. It comprises a 16 bits shift register 18, three exclusive OR gates 20, 22 and 24, and a NOT circuit 26. The shift register 18 has first to 16th output terminals indicated at (1) through (16) respectively. Of these, the 11th and 13th output terminals are connected respectively to the two inputs of the first exclusive OR gate 20, whereas the 14th and 16th output terminals are connected respectively to the two inputs of the second exclusive OR gate 22. The outputs of the two OR gates 20 and 22 are connected respectively to the two inputs of the third exclusive OR gate 24. The output of this third OR gate is connected to the data input of the shift register 18 via the NOT circuit 26. The shift register 18 has a clock input connected to a clock, not shown, which generates pulses at a repetition rate of, in this particular embodiment, 88.2 kilohertz.

With the impression of each clock pulse to the shift register 18, a different set of pseudorandom pulses are produced from its 16 outputs. It takes $(2^n-1)$ clock pulses, where n is the number of the bits of the shift register 18, for this shift register to complete the production of one cycle of such different sets of pulses. Therefore, one cycle of the digital pulses from the 16 outputs of the shift register 18 is $(2^n-1)$, or $(2^{16}-1)$ in the present case, times one cycle of the clock pulses. This cycle of the shift register output pulses is so long in comparison with the cycles of the analog data signal to be obtained, that the pulses can be thought of as being essentially nonperiodic with respect to the data signal. We have therefore employed the substantially random 12 bits digital signal from the first to 12th output terminals of the shift register 18 as the digital dither signal as being equivalent to a white noise signal.

With reference back to FIG. 1, the digital dither generator 14 puts out the digital dither signal in synchronism with the incoming digital data signal, for delivery to the adder 12 via the gate circuit 16. As shown in detail in FIG. 3, the gate circuit 16 comprises 12 electronic switches S1 through S11 and S12 connected respectively to 12 transmission lines L1 through L11 and L12 over which the 12 bits of the digital dither signal travel in parallel. The switches S1 through S12 are all normally closed.

Employed for the on/off control of the electronic switches S1 through S12 of the gate circuit 16 is a level discriminating circuit 28 which functions to prevent the passage of the digital dither signal through the gate circuit 16 when the level of the incoming digital data signal exceeds a predetermined limit.

Figure 3:
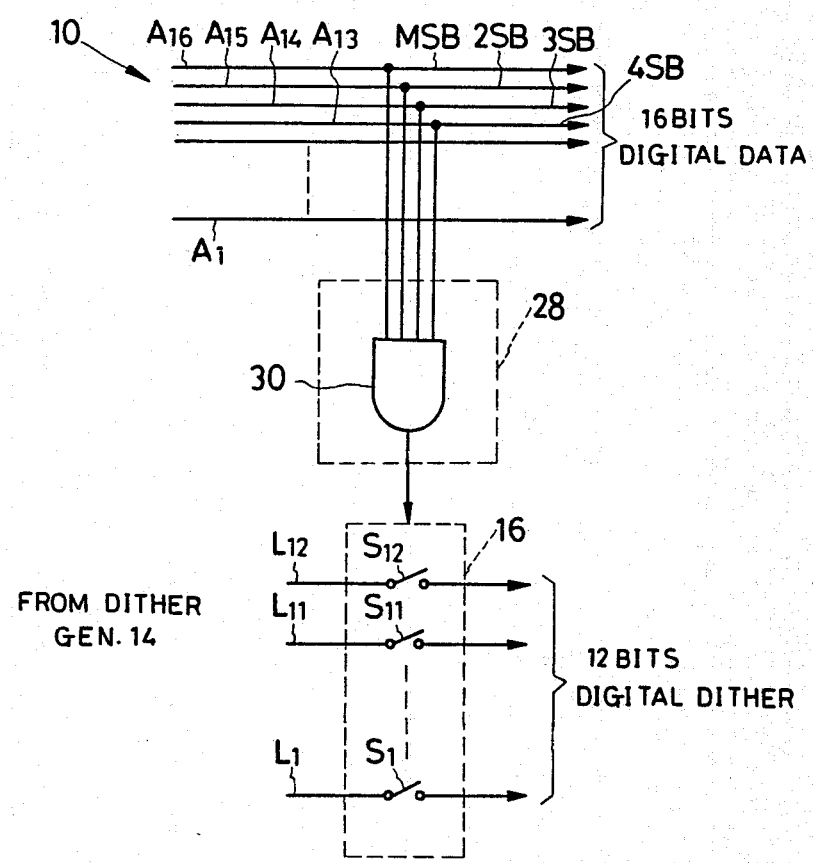
FIG. 3 is a schematic electrical diagram showing in particular a level discriminating circuit and gate circuit used in the system of FIG. 1.

As shown also in FIG. 3, we have employed a four inputs AND gate 30 as the level discriminating circuit 28 in this particular embodiment. Designated A1 through A16 in this figure are the 16 bits digital data signal transmission lines from input circuit 10 to adder 12. The four A13 through A16 of these 16 lines, through which there journey the four most significant bits MSB, 2SB, 3SB and 4SB of the digitital data signal, are connected to the four inputs of the AND gate 30 constituting the level discriminating circuit 28. Consequently, only when the four most significant bits of the incoming data signal are all binary ONEs, the output from the AND gate 30 goes high to open the switches S1 through S12 of the gate circuit 16. It will therefore be seen that the level discriminating circuit 28 serves to discriminate whether or not the level of the incoming data signal is less than a predetermined limit of "1111000000000000". The gate circuit 16 blocks the dither signal when the level of the data signal is not less than this limit.

Connected to the input circuit 10 and gate circuit 16 as aforesaid, the adder 12 adds the 16 bits digital data signal and the 12 bits digital dither signal, provided, of course, that the data signal level is less than the above limit. The output from the adder 12 is of 16 bits. We will refer to the addition of the data and dither signals as the data/dither signal. It should be noted, however, that the output from the adder 12 may consist of either the data/dither signal or the data signal only.

The adder 12 has its output connected to a first D/A converter 32 of known configuration comprising a ladder network of resistors, not shown, for converting the 16 bits adder output from digital to analog form. The capacity of this D/A converter 32 is limited to 16 bits in this particular embodiment, as is the capacity of the adder 12. In practice the D/A converter 32 may take the form of the IC chip PCM 53 JP-V manufactured by Burr-Brown Corporation.

At 34 is shown a second D/A converter having its input connected directly to the gate circuit 16. This second D/A converter, which can be of the same configuration as the first D/A converter 32, translates the 12 bits digital dither signal that has been allowed to pass through the gate circuit 16, into an analog dither or white noise signal composed of various frequency components ranging from zero to 44.1 kilohertz.

The two D/A converters 32 and 34 are connected respectively to the two inputs of an analog substracter 36. This subtracter subtracts the analog dither signal from the analog data/dither signal and puts out an analog data signal as a replica of the digital data signal. The output 38 of the subtracter 36, or of the complete digital to analog conversion system, may be conventionally connected to a low pass filter, means for the removal of glitches from the analog data signal, etc.

Operation

The input circuit 10 inputs the 16 bits digital data signal at the sampling rate of 88.2 kilohertz, while the dither generator 14 puts out the 12 bits digital dither signal at the same sampling rate. The level of the digital dither signal becomes maximum when its 12 bits are all binary ONEs. Even when this maximum level dither signal is added to the digital data signal, the magnitude of the resulting data/dither signal does not exceed 16 bits if all the four most significant bits MSB, 2SB, 3SB and 4SB of the data signal are not binary ONES. Accordingly, the adder 12 will add the digital data and dither signals within its capacity, putting out the digital data/dither signal for translation into analog form by the subsequent D/A converter 32.

However, when the four most significant bits of the incoming data signal are all binary ONEs, the total level of this data signal and the dither signal may exceed 16 bits. We have stated that the capacities of both adder 12 and D/A converter 32 are limited to 16 bits.

As will be seen by referring again to FIG. 3, the AND gate 30 of the level discriminating circuit 28 causes nonconduction through the gate circuit 16 when all the four most significant bits of the incoming digital data signal are binary ONEs. Thus the digital data signal passes through the adder 12 with no dither added. The first D/A converter 32 converts only the data signal from digital to analog form. However, the digital dither signal is gated off usually for such a short period of time, and the quantization noise is so small when the data level is high, that any adverse effects of digital to analog conversion without use of dither is negligible.

Such an adverse effect, if any, is more than offset by the advantage of the greater dynamic range offered in accordance with our invention. As the digital dither signal is gated off as above, all the 16 bits of the D/A converter 32 are used for the 16 bits data signal, so that a wider dynamic range is gained with use of a D/A converter of the same capacity as heretofore. We have ascertained by experiment that this FIG. 1 system can faithfully reproduce audio signals ranging in frequency from zero to about 20 kilohertz.

Second Form

Figure 4:
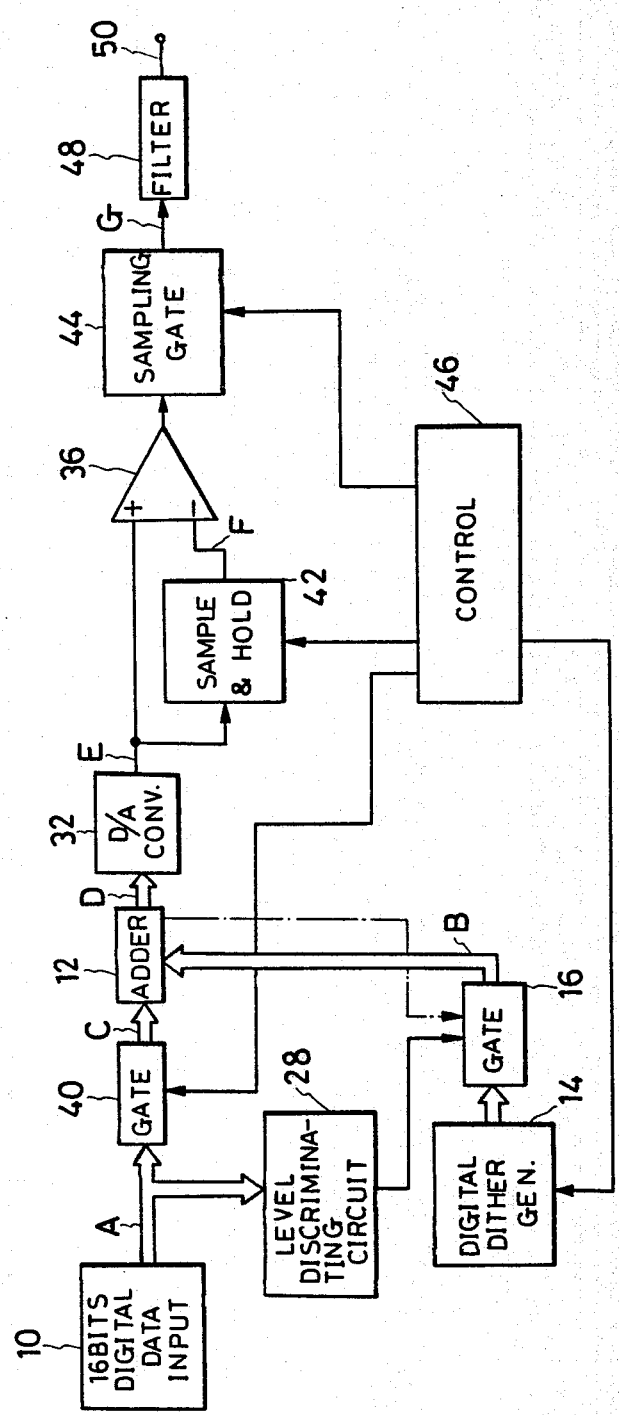
FIG. 4 is a block diagram of another preferred form of the digital to analog conversion system in accordance with our invention.

We have illustrated in FIG. 4 another preferred embodiment which in fact is an adaptation of our invention for the digital to analog conversion system described and claimed in Araki et al. copending U.S. patent application Ser. No. 810,975 filed Dec. 19, 1985, under the title of "Digital to Analog Conversion Method and System with the Introduction and Later Removal of Dither".

This second system also comprises the 16 bits data input circuit 10, 16 bits adder 12, 12 bits digital dither generator 14, gate circuit 16, level discriminating circuit 28, 16 bits D/A converter 32, and subtracter 36, all connected substantially as in the FIG. 1 embodiment. The second D/A converter 34 of the preceding embodiment is absent. The single D/A converter 32 employed in this second system processes both of the data/dither signal and the dither signal by time division multiplexing.

Employed for such time division multiplexing are a gate circuit 40, sample and hold circuit 42, sampling gate circuit 44, control circuit 46, and low pass filter 48. The additional gate circuit 42 is connected between input circuit 10 and adder 12. The sample and hold circuit 42 is connected between the D/A converter 32 and the negative input of the subtracter 36, the positive input of which is connected directly to the D/A converter 32. The output of the subtracter 36 is connected to the sampling gate circuit 44 and thence to the low pass filter 48, the latter being coupled to a system output terminal 50. The control circuit 46 controls the operation of the dither generator 14, gate circuit 40, sample and hold circuit 42, and sampling gate circuit 44 in prescribed time relationship to one another.

Operation of the Second Form

Figure 5:
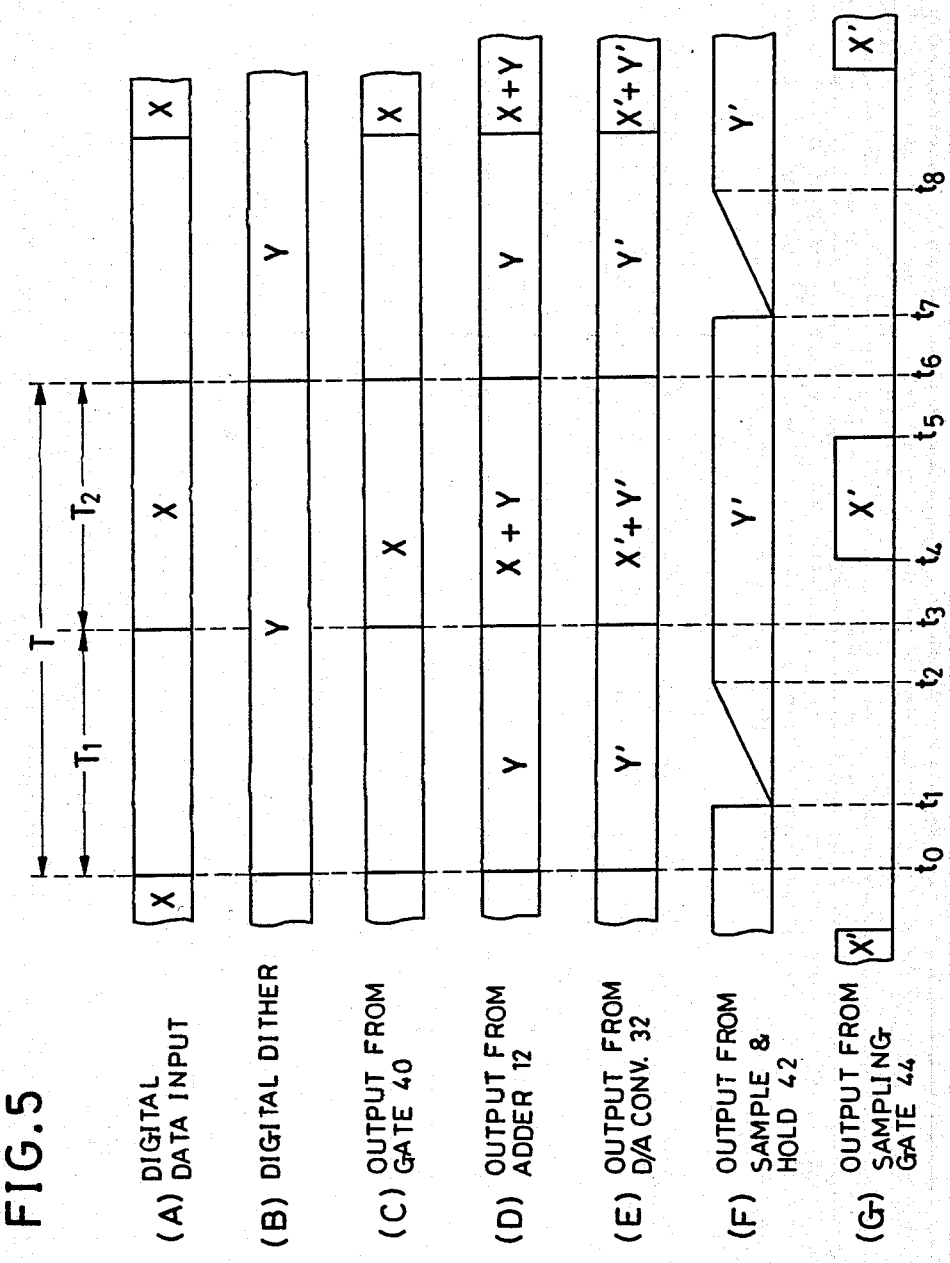
FIG. 5 is a timing diagram showing in proper time relationship the signals appearing in various parts of the FIG. 1 system in order to explain its operation.

In the course of the following operational description of the FIG. 4 system, we will refer also to FIG. 5 which plots at (A) through (G) the signals useful in explaining the operation. In FIG. 4 we have indicated by the same capitals A through G the parts where the correspondingly designated signals of FIG. 5 appear, for the easier understanding of the operation. We have plotted the signals of FIG. 5 on the assumption that the level of the incoming digital data signal is less than the predetermined limit, with the digital dither signal delivered from generator 14 to adder 12 via the gate circuit 16.

At (A) in FIG. 5 is shown a digital stereophonic audio (data) signal X received by the input circuit 10. The input signal X is a time division multiplexing of a left channel data signal, transferred during the first half T1 (as from moment t0 to moment t3) of each sampling period T, and a right channel data signal transferred during the second half T2 (as from moment t3 to moment t6) of each sampling period T.

As shown at (B) in FIG. 5, the digital dither generator 14 generates and puts out the digital dither signal Y, composed of successive sets of pseudorandom pulses, at the same sampling rate as the data signal X. Of course, both data signal X and dither signal Y retain the same values at least during each sampling period T. The dither signal Y is delivered to the adder 12 via the gate circuit 16, the latter being now assumed to be conductive.

The gate circuit 40 inputs from the control circuit 46 a series of gating pulses each lasting as from moment t3 to moment t6. Consequently, as shown at (C) in FIG. 5, only the right channel data signal X is permitted to pass through the gate circuit 40 during the second half T2 of each sampling period T. The thus gated right channel data signal is to be subsequently converted from digital to analog form by the means of FIG. 3, as set forth hereinbelow. The left channel data signal is to be likewise converted by similar means which we have not shown for the simplicity of illustration.

The adder 12 adds in parallel the 12 bits digital dither signal Y of FIG. 5(B) and the 16 bits digital data signal X of FIG. 5(C), putting out the time division multiplex signal give at (D) in FIG. 5. The multiplex output from the adder 12 is composed of the digital dither signal Y during the first half T1 of each sampling period T and the digital data/dither signal X+Y during the second half T2 of each sampling period. As in the FIG. 1 embodiment, the data/dither signal X+Y is an addition of the data signal X and the dither signal Y.

The adder 12 delivers its multiplex output to the D/A converter 32, so that the latter produces the corresponding analog output represented at (E) in FIG. 5. The multiplex analog output from the D/A converter 32 is composed of an analog dither signal Y' and an analog data/dither signal X'+Y'.

The D/A converter 32 delivers its multiplex analog output both to the positive input of the subtracter 36 and to the sample and hold circuit 42. Under the control of the control circuit 46, the sample and hold circuit 42 samples the incoming multiplex analog signal as from moment t1 to moment t2 during each sampling period T. The period of time from moment t1 to moment t2 is included in the first half T1 of each sampling period T, during which the D/A converter 32 puts out the analog dither signal Y' as at (E) in FIG. 5. Accordingly, the sample and hold circuit 42 extracts the analog dither signal Y' from the multiplex output from the D/A converter 32 and holds the sample until the next sampling period from moment t7 to moment t8. The output from the sample and hold circuit 42 is therefore as seen at (F) in FIG. 5. This output is delivered to the negative input of the subtracter 36.

Thus the subtracter 36 subtracts the analog dither signal Y' of FIG. 5(F) from the multiplex analog data/dither signal X' + Y' and analog dither signal Y' of FIG. 5(E). Although we have not shown the resulting output from the subtracter 36, it will be evident from a comparison of (E) and (F) in FIG. 5 that the subtracter output comprises the analog data signal X' during the second half T2 of each sampling period T.

It will be appreciated that the output from the subtracter 36 is free from the possible offset voltage of the D/A converter 32. This is because the both inputs to the subtracter 36 contain such possible offset voltages.

However, the analog dither signal Y' from the sample and hold circuit 42 is such that the subtracter output usually contains extraneous signal components other than the desired analog data signal X'. We have therefore employed in the embodiment the sampling gate circuit 44 for the removal of such undesired signal components. As dictated by the control circuit 46, the sampling gate circuit 44 samples the analog data signal X' as from moment t4 to moment t5 during the second half T2 of each sampling period T, with the resulting output indicated at (G) in FIG. 5. Each sample of the analog data signal X' put out by the sampling gate circuit 44 will be free from glitches or the like that may have been contained in the subtracter output in the vicinities of the opposite extreme moments t3 and t6 of the second half T2 of each sampling period T.

These samples of the analog data signal X' are interpolated by the low pass filter 48 into the complete analog signal preparatory to reproduction as audible sound.

As has been set forth in connection with the FIG. 1 embodiment, the level discriminating circuit 28 functions to cause nonconduction through the gate circuit 16 when the level of the incoming digital data signal X exceeds the predetermined limit. Thus blocked by the gate circuit 16, the digital dither signal Y is then not added to the digital data signal X. Only the 16 bits data signal is then supplied to the D/A converter 32. We believe that the subsequent operation of the FIG. 4 embodiment is self evident from the foregoing operational description.

Third Form

Figure 6:
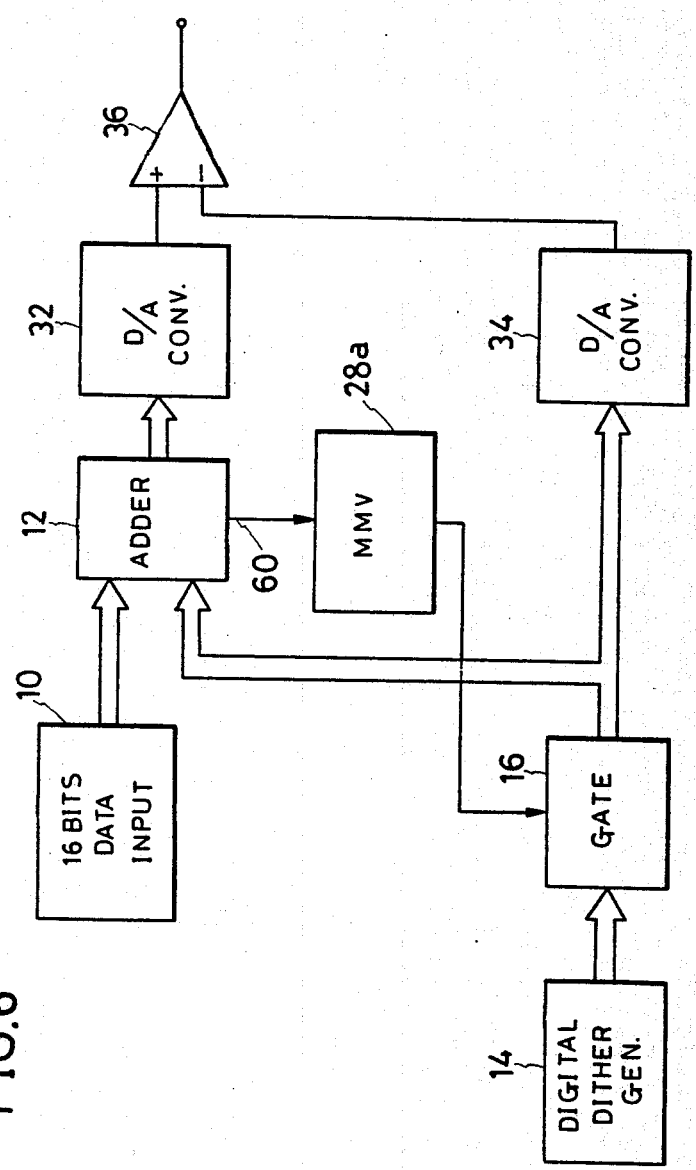
FIG. 6 is a block diagram of still another preferred form of the digital to analog conversion system in accordance with our invention.

In the FIG. 1 system we have gated the digital dither signal by discriminating the level of the incoming digital data signal. FIG. 6 shows a modified digital to analog conversion system wherein the digital dither signal is gated on or off depending upon the total level of the addition of the digital data and dither signals.

Thus, instead of connecting the level discriminating circuit 28 between input circuit 10 and gate circuit 16 as in the FIG. 1 embodiment, we have employed as a gate control circuit a monostable multivibrator (MMV) 28a which has its trigger input connected to the carry or overflow output 60 of the adder 12 of the full adder configuration. The output of the MMV 28a is connected to the control input of the gate circuit 16. The other constructional details of this FIG. 6 system are as previously set forth in conjunction with FIG. 1.

As in the FIG. 1 embodiment, the digital data signal is composed of 16 bits whereas the digital dither signal is composed of 12 bits. Also, the adder 12 and first D/A converter 32 are both of 16 bits design. When the sum of the 16 bits digital data signal and 12 bits digital dither signal exceeds the 16 bits capacity of the adder 12, the carry output from the adder 12 goes high, indicating overflow. The MMV 28a responds to this overflow signal for causing the gate circuit 16 to inhibit the passage of the digital dither signal for a preassigned length of time thereafter. We will explain such operation in more detail with reference to the timing diagram of FIG. 7.

Figure 7:
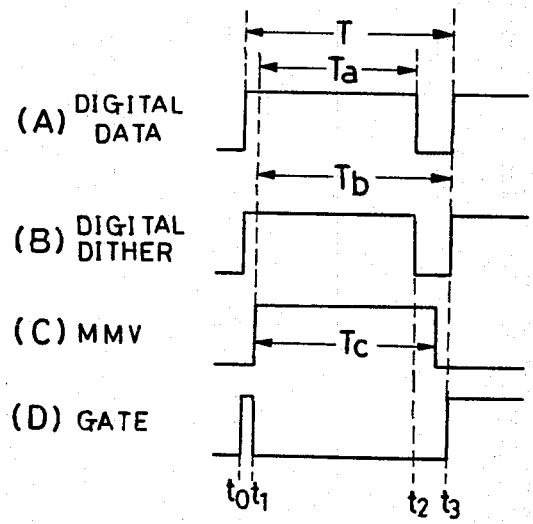
FIG. 7 is a timing diagram showing in proper time relationship the signals appearing in various parts of the FIG. 6 system in order to explain its operation.

Let it be supposed that the adder 12 has overflowed by concurrently receiving the digital data signal of FIG. 7(A) and the digital dither signal of FIG. 7(B). The carry output from the adder 12 will go high at the moment of the leading edges of these signals. Triggered by this overflow signal, the MMV 28a will go high and remain so for a prescribed period of time Tc, as indicated at (C) in FIG. 7, during which period the gate circuit 16 blocks the passage of the digital dither signal as at (D) in FIG. 7.

It will be observed from FIG. 7 that the time Tc during which the MMV 28a remains in the unstable state is longer than the period Ta from the trigger moment to the end of the sampling period T in question of the digital data (and dither) signal, and is shorter than the period Tb from the trigger moment to the beginning of the next sampling period T of the digital data signal. Accordingly, the digital signal is held gated off during most of the period when the digital data signal of an excess level is incoming. Only the digital data signal is admitted through the adder 12 into the first D/A converter 32 from the moment t1 immediately following the starting moment t0 of the sampling period T.

The period from moment t0 to moment t1, during which overflow takes place, is too short to affect the quality of the sound reproduced to any noticeable degree. It is, moreover, easy to compensate for such a brief overflow, as by connecting a sampling gate circuit, similar to the one shown at 44 in FIG. 4, to the output of the subtracter 36.

The discrimination of the excess level of the digital data signal by the overflow from the adder 12 may be performed for each sampling period of the data signal.

Fourth Form

Figure 8:
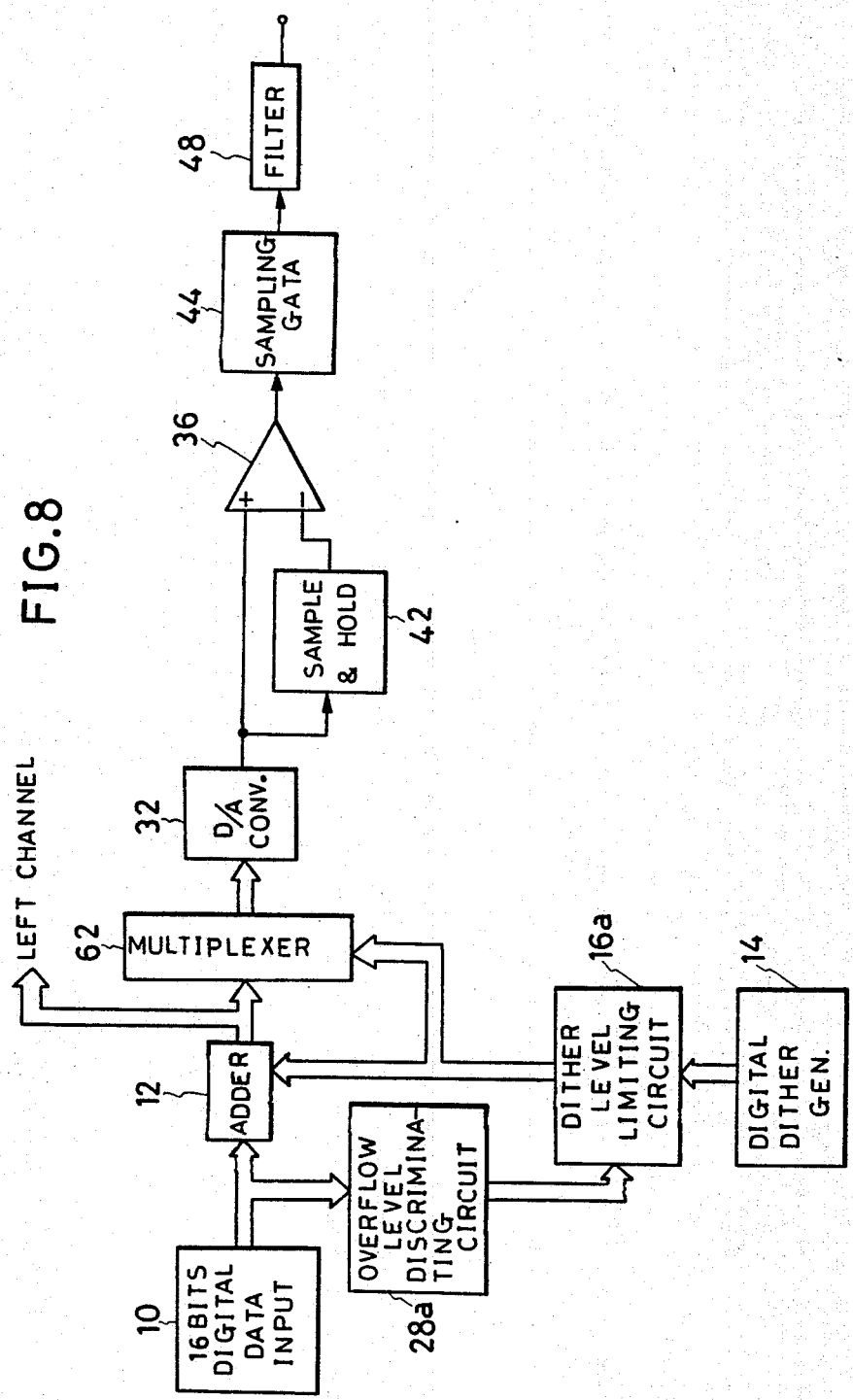
FIG. 8 is a block diagram of yet another preferred form of the digital to analog conversion system in accordance with our invention.

FIG. 8 shows a further preferred form of the digital to analog conversion system of our invention. This system may be thought of as a modification of the FIG. 4 system in the sense that the digital data/dither signal and the digital dither signal are multiplexed for joint conversion into analog form by the common D/A converter. However, we have additionally employed in this modified system a multiplexer 62 between adder 12 and D/A converter 32 for the time division multiplexing of the digital data/dither signal and the digital data signal.

The gate circuit 16 of the FIG. 4 system is replaced by a dither level limiting circuit 16a capable of variably reducing the level of the digital dither signal. The dither level limiting circuit 16a has its input connected to the digital dither generator 14 and its output to both the adder 12 and the multiplexer 62. The level discriminating circuit 28 of the FIG. 4 system is also replaced by an overflow level discriminating circuit 28a, which is connected between the input circuit 10 and the control input of the dither level limiting circuit 16a. As the name implies, the overflow level discriminating circuit 28a discriminates the level of the incoming digital data signal to determine the possibility of whether or not the total level of the addition of the 16 bits digital data signal and the 12 bits digital dither signal will exceed 16 bits. Further, when this possibility is found to exist, the overflow level discriminating circuit 28a causes the dither level limiting circuit 16a to reduce the level of the digital dither signal to an extent necessary to make the total level of the data and dither signals fall within the limit of 16 bits.

This FIG. 8 system is substantially similar in the other constructional details to that of FIG. 4.

Figure 9:
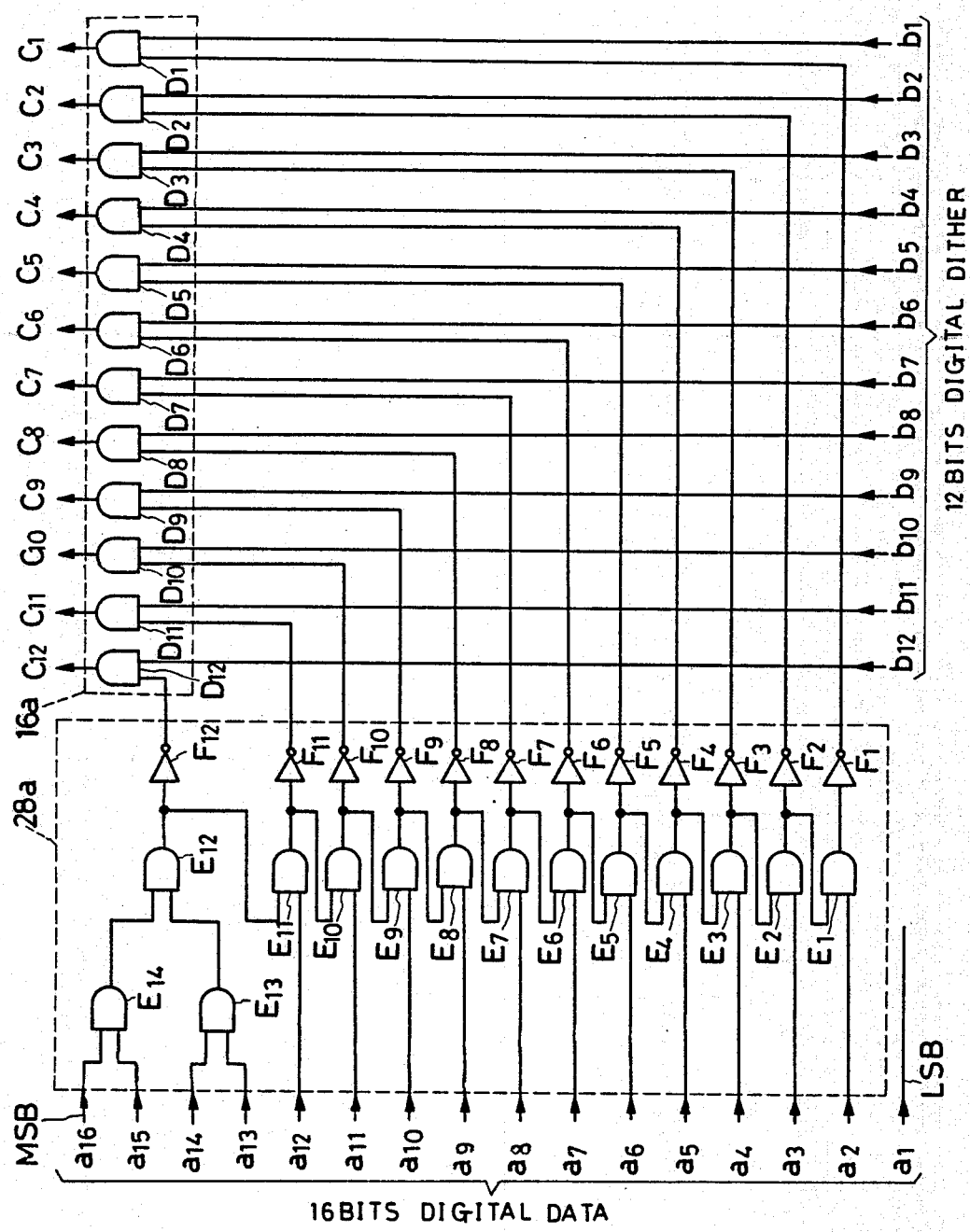
FIG. 9 is a schematic electrical diagram of an overflow level discriminating circuit and dither level limiting circuit used in the system of FIG. 8.

FIG. 9 is a detailed illustration of the overflow level discriminating circuit 28a and dither level limiting circuit 16a. The dither level limiting circuit 16a comprises 12 AND gates D1 through D12 each having two inputs. The first inputs of all these AND gates are connected to the 12 outputs terminals of the digital dither generator 14, FIG. 2, by way of input lines b1 through b12, respectively. The 12 bits of the digital dither signal are therefore individually controlled by the respective AND gates D1 through D12. These AND gates have output terminals C1 through C12 for connection to the adder 12 and multiplexer 62 as in FIG. 8. The second inputs of the AND gates D1 through D12 are all connected to the overflow level discriminating circuit 28a as in the following.

The overflow level discriminating circuit 28a is connected to all but the line a1, associated with the least significant bit LSB, of 16 bits digital data lines a1 through a extending from the input circuit 10. The lines a2 through a12, associated with the fifteenth through fifth significant bits respectively, are connected respectively to AND gates E1 through E11 and thence to NOT circuits F1 through F11, both included in the overflow level discriminating circuit 28a. The NOT circuits F1 through F11 are connected to the noted second inputs of the AND gates D1 through D11, respectively, of the dither level limiting circuit 16a. The third and fourth significant bit lines a1 and a13 are connected respectively to the two inputs of another AND gate E13. The most and second significant bit lines a16 and a15 are connected respectively to the two inputs of still another AND gate E14. The outputs of these two AND gates E13 and E14 are connected to the inputs of a further AND gate E12, the output of which is connected via a NOT circuit F12 to the second input of the maximum bit AND gate D12 of the dither level limiting circuit 16a. The output of the AND gate E12 is further connected to the AND gate E11 associated with the fifth significant bit of the digital data signal. Also, the outputs of the AND gate E2 through E11 are each connected to the AND gate associated with the next less significant bit of the digital data signal.

Operation of the Fourth Form

The digital dither signal from the generator 14 has the maximum value when all its 12 bits are binary ONEs. Should this maximum value dither signal be added to the digital data signal when the four most significant bits (associated with the data lines a13 through a16 of FIG. 9) of the latter are also all binary ONEs, then the total level of the digital data and dither signals might exceed 16 bits or digit places. It is apparent, then, that when any one of the four most significant bits of the data signal is binary ZERO, the total level of the data and dither signals does not exceed 16 bits even if the dither signal has the maximum value.

With this in mind, let us study the gate arrangement of the overflow level discriminating circuit 28a of FIG. 9. When any one of the four most significant bits of the incoming digital data signal is binary ZERO, the output from either of the AND gates E13 and E14 is low, and so is the output from the AND gate E12, as well as the outputs from all the other AND gates E1 through E11. Therefore, the outputs from all the NOT circuits F1 through F12 are high. These high outputs from the overflow level discriminating circuit 28a are impressed to all the AND gates D1 through D12 of the dither level limiting circuit 16a. Thus this circuit 16a permits the passage of the digital dither signal from the generator 14 without reducing its level.

Let us suppose that the five most significant bits of the incoming digital data signal are "11110". Then the outputs from the AND gates E13 and E14 are both high, and so is the output from the AND gate E12. As the output from the NOT circuit F12 is low, the AND gate D12 of the dither level limiting circuit 16a blocks the most significant bit of the digital dither signal from the generator 14.

However, since the fifth significant bit of the data signal, associated with the data line a12, is binary ZERO, the output from the AND gate E11 is low. The resulting high output from the NOT circuit F11 permits the passage of the second significant bit of the digital dither signal through the AND gate D11 of the dither level limiting circuit 16a. As the output from the AND gate E11 is low as above stated, so are the outputs from all the AND gates E1 through E10 associated with the less significant bits of the data signal. The correspond high outputs from the NOT circuits F1 through F10 permit the passage of the remaining bits of the dither signal through the AND gate D1 through D10 of the dither level limiting circuit 16a.

Thus, when the five most significant bits of the data signal are "11110", the overflow level discriminating circuit 28a and dither level limiting circuit 16a coact to allow all but the most significant one of the 12 bits of the dither signal to be added to the data signal. The total level of the resulting data/dither signal is not to exceed 16 bits even if all the 11 bits of the dither signal that have been added to the data signal are binary ONEs.

Let us further assume that the six most significant bits of the incoming digital data signal are "111110." Then the outputs from the NOT circuits F11 and F12 of the overflow level discriminating circuit 28a are both low, blocking the passage of the two most significant bits of the dither signal to pass through the AND gates D11 and D12 of the dither level limiting circuit 16a. However, the output from the AND gate E10 of the overflow level discriminating circuit 28a, associated with the sixth significant bit of the data signal, is now low, and so are the outputs from the other AND gates E1 through E9 associated with the less significant bits of the data signal. The outputs from the NOT circuits F1 through F10 are therefore all high, permitting the 10 less significant bits of the dither signal to pass through the AND gates D1 through D10 of the dither level limiting circuit 16a.

We believe we have made clear by the foregoing that, the higher the level of the incoming digital data signal, the less is made the level of the digital dither signal to be added thereto. If all but the least significant one of the 16 bits of the data signal are all binary ONEs, then the outputs from all the NOT circuits F1 through F12 of the overflow level discriminating circuit 28a are low, causing the dither level limiting circuit 16a to block all the bits of the dither signal.

In short, the dither signal is added to the data signal as long as all but the least significant one of the 16 bits of the data signal are not binary ONEs. If Ns most significant bits of the data signal are binary ONEs, and if the Ns+1'th bit is binary ZERO, the number of bits of the dither signal is reduced to (15−Ns).

The definite advantage thus gained is that dither is added even when the data signal level is relatively high, without the possibility of the resulting data/dither signal overflowing from the D/A converter. The 16 bits digital data signal has $2^{16}$ (=65,536) different levels. Of these, as many as 65,534 levels of the data signal are combined with the digital dither signal of correspondingly controlled levels.

As will be seen by referring back to FIG. 8, the digital dither signal of the above controlled level is directed both to the adder 12 and to the multiplexer 62. The adder 12 adds the dither signal to the digital data signal to form the digital data/dither signal, which is delivered to the multiplexer 62. This multiplexer operates in the known manner to create the time division multiplexing of the digital data/dither signal and digital dither signal shown at (D) in FIG. 5. The subsequent operation of the FIG. 8 system is as previously described with reference to FIG. 4.

Possible Modifications

Although we have shown and described our invention in terms of some preferable embodiments thereof, we recognize, of course, that our invention could be embodied in other forms within the broad teaching hereof. It will also be apparent that our invention is applicable to the digital to analog conversion of not only audio signals but also video and other signals. The following is a brief list of possible modifications or alterations of the illustrated embodiments which we believe fall within the scope of our invention:

1. The data input to the adder 12 may be of 2's s complement code, which is equivalent to the offset binary code except that the MSB is inverted. Thus, in the FIGS. 1 and 4 systems, a NOT circuit may be connected to the MSB input line of the AND gate 30, FIG. 3, of the level discriminating circuit 28 for the level discrimination of the 2's s complement code data. Further, in the case of the FIG. 8 system, a NOT circuit may be connected to the MSB input line of the AND gate E14, FIG. 9, of the overflow level discriminating circuit 28a.
2. The level discriminating circuit 28 and gate circuit 16 of the FIG. 1 system could be replaced by the overflow level discriminating circuit 28a and dither lever limiting circuit 16a of the FIG. 8 system.
3. The gate circuit 16 of the FIG. 4 system could be controlled by the carry output from the adder 12, as indicated by the dashed line in FIG. 4, instead of by the output from the level discriminating circuit 28, thereby combining the teachings of FIG. 6 with the time division multiplexing of the data/dither signal and the dither signal suggested by the FIG. 4 system.
4. In the FIGS. 4 and 8 systems, the sample and hold circuit 42 could be used for extracting the analog data/dither signal from the multiplexed signal.
5. Also in the FIGS. 4 and 8 systems, the sampling gate circuit 44 could be connected on the input side of the subtracter 36 for extracting the analog data/dither signal. The dither component might then be removed from this data/dither signal by the subtracter 36.
6. The adder 12 of the FIG. 6 system could be connected in parallel with an additional adder devoted solely for the production of the overflow signal for triggering the MMV 28a.
7. The data and dither signals may be composed of the same number of bits in the FIG. 6 system.
8. The digital data (audio) signal could be monophonic, instead of being stereophonic as in FIG. 5; that is, the first half T1 of each sampling period T could be either blank or of the same signal content as the second half T2.
9. The digital dither generator 14 could be replaced by an analog dither generator in combination with an analog to digital converter.

We claim:

1. In a method of converting a digital data signal having a predetermined number of bits, such as a digitized audio signal, into an analog signal by generating a digital dither signal having a smaller number of bits than the digital data signal, adding the digital dither signal to the digital data signal to provide a digital data/dither signal, converting the digital data/dither signal and the digital dither signal into an analog data/dither signal and an analog dither signal respectively, and subtracting the analog dither signal from the analog data/dither signal to obtain an analog data signal equivalent to the digital data signal, the improvement which comprises discriminating the level of the incoming digital data signal to ascertain whether or not the total level of the associated digital data/dither signal will exceed the capacity of a digital to analog converter used for the conversion of at least the data/dither signal, and inhibiting the addition of the digital dither signal to the digital data signal when the total level of the digital data/dither signal has been ascertained to exceed the capacity of the digital to analog converter.

2. In a method of converting a digital data signal such as a digitized audio signal into an analog signal by adding a digital dither signal to the digital data signal to provide a digital data/dither signal, converting the digital data/dither signal and the digital dither signal into an analog data/dither signal and an analog dither signal respectively, and subtracting the analog dither signal from the analog data/dither signal to obtain an analog data signal equivalent to the digital data signal, the improvement which comprises inhibiting the addition of the digital dither signal to the digital data signal when the total level of the associated digital data/dither signal exceeds the capacity of a digital to analog converter used for the conversion of at least the data/dither signal.

3. In a method of converting a digital data signal having a predetermined number of bits, such as a digitized audio signal, into an analog signal by generating a digital dither signal having a smaller number of bits than the digital data signal, adding the digital dither signal to the digital data signal to provide a digital data/dither signal, converting the digital data/dither signal and the digital dither signal into an analog data/dither signal and an analog dither signal respectively, and subtracting the analog dither signal from the analog data/dither signal to obtain an analog data signal equivalent to the digital data signal, the improvement which comprises discriminating the level of the incoming digital data signal to ascertain whether or not the total level of the associated digital data/dither signal will exceed the capacity of a digital to analog converter used for the conversion of at least the data/dither signal, and, when the total level of the digital data/dither signal has been ascertained to exceed the capacity of the digital to analog converter, reducing the level of the digital dither signal to an extent necessary to make the total level of the digital data/dither signal to fall within the capacity of the digital to analog converter.

4. A system for faithfully converting a digital data signal such as a digitized audio signal into an analog signal, comprising:
(a) input means for receiving a digital data signal composed of a first predetermined number of bits;
(b) a dither generator for generating a digital dither signal composed of a second predetermined number of bits less than the first predetermined number of bits;
(c) a level discriminating circuit connected to the input means for discriminating whether the level of the incoming digital data signal exceeds a predetermined limit or not;
(d) a gate circuit connected both to the dither generator and to the level discriminating circuit for permitting the passage therethrough of the digital dither signal when the level of the incoming digital data signal does not exceed the predetermined limit, and for inhibiting the passage of the digital dither signal when the level of the incoming digital data signal exceeds the predetermined limit;
(e) an adder connected both to the input means and to the gate circuit for adding the digital data signal and the digital dither signal to provide a digital data/dither signal;
(f) a first digital to analog converter connected to the adder for converting the data/dither signal from digital to analog form;
(g) a second digital to analog converter connected to the gate circuit for converting the dither signal from digital to analog form; and
(h) a subtracter connected to both the first and second digital to analog converters for subtracting the analog dither signal from the analog data/dither signal to provide an analog data signal equivalent to the digital data signal.

5. A system for faithfully converting a digital data signal such as a digitized audio signal into an anlog signal, comprising:
(a) input means for receiving a digital data signal composed of a first predetermined number of bits;
(b) a dither generator for generating a digital dither signal composed of a second predetermined number of bits less than the first predetermined number of bits;
(c) a level discriminating circuit connected to the input means for discriminating whether the level of the incoming digital data signal exceeds a predetermined limit or not;
(d) a gate circuit connected both to the dither generator and to the level discriminating circuit for permitting the passage therethrough of the digital dither signal when the level of the incoming digital data signal does not exceed the predetermined limit, and for inhibiting the passage of the digital dither signal when the level of the incoming digital data signal exceeds the predetermined limit;
(e) time division multiplexing means connected both to the input means and to the gate circuit for time division multiplexing the digital dither signal and a digital data/dither signal, the latter being an addition of the digital data signal and the digital dither signal;
(f) a digital to analog converter connected to the time division multiplexing means for converting the multiplexed dither signal and data/dither signal from digital to analog form to provide an output comprised of an analog dither signal and an analog data/dither signal; and
(g) dither removing circuit means connected to the digital to analog converter for removing the analog dither signal from the analog data/dither signal to provide an analog data signal equivalent to the digital data signal.

6. A system for faithfully converting a digital data signal such as a digitized audio signal into an analog signal, comprising:
(a) input means for receiving a digital data signal;
(b) a dither generator for generating a digital dither signal;
(c) a gate circuit connected to the dither generator for permitting the selective passage therethrough of the digital dither signal;
(d) an adder connected both to the input means and to the gate circuit for adding the digital dither signal to the digital data signal to provide a digital data/dither signal, the adder having an overflow output for producing an overflow signal when the level of the digital data/dither signal exceeds a predetermined limit;
(e) a gate control circuit connected between the overflow output of the adder and the gate circuit and responsive to the overflow signal for causing the gate circuit to inhibit the passage therethrough of the digital dither signal for a prescribed period of time;
(f) a first digital to analog converter connected to the adder for converting the data/dither signal from digital to analog form;
(g) a second digital to analog converter connected to the gate circuit for converting the dither signal from digital to analog form; and
(h) a subtracter connected to both the first and second digital to analog converters for subtracting the analog dither signal from the analog data/dither signal to provide an analog data signal equivalent to the digital data signal.

7. A system for faithfully converting a digital data signal such as a digitized audio signal into an analog signal, comprising:
(a) input means for receiving the digital data signal;

(b) a dither generator for generating a digital dither signal;
(c) a gate circuit connected to the dither generator for permitting the selective passage of the digital dither signal therethrough;
(d) time division multiplexing means connected both to the input means and to the gate circuit for time division multiplexing the digital dither signal and and a digital data/dither signal, the time division multiplexing means including an adder for adding the digital data signal and the digital dither signal to provide the digital data/dither signal, the adder having an overflow output for producing an overflow signal when the level of the digital data/dither signal exceeds a predetermined limit;
(e) a gate control circuit connected between the overflow output of the adder and the gate circuit and responsive to the overflow signal for causing the gate circuit to inhibit the passage therethrough of the digital dither signal for a prescribed period of time;
(f) a digital to analog converter connected to the time division multiplexing means for converting the multiplexed dither signal and data/dither signal from digital to analog form to provide an output comprised of an analog dither signal and an analog data/dither signal; and
(g) dither removing circuit means connected to the digital to analog converter for removing the analog dither signal from the analog data/dither signal to provide an analog data signal equivalent to the digital data signal.

* * * * *